(12) United States Patent
Balszunat et al.

(10) Patent No.: US 6,954,013 B2
(45) Date of Patent: Oct. 11, 2005

(54) CONTROLLER AND RECTIFIER FOR AN ELECTRICAL MACHINE, AND ELECTRICAL MACHINE

(75) Inventors: Dirk Balszunat, Tuebingen (DE); Reinhard Milich, Reutlingen (DE); Achim Henkel, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/493,007

(22) PCT Filed: Dec. 7, 2002

(86) PCT No.: PCT/DE02/04497

§ 371 (c)(1),
(2), (4) Date: Apr. 19, 2004

(87) PCT Pub. No.: WO03/084026

PCT Pub. Date: Oct. 9, 2003

(65) Prior Publication Data

US 2005/0007708 A1 Jan. 13, 2005

(30) Foreign Application Priority Data

Mar. 28, 2002 (DE) .......................................... 102 14 277

(51) Int. Cl.[7] .............................................. H02K 11/00
(52) U.S. Cl. ...................... 310/68 D; 310/68 R; 310/71
(58) Field of Search ................................ 310/68 D, 54, 310/58, 64, 52, 71, 68 C, 239, 68 R; 363/145; 29/596–589

(56) References Cited

U.S. PATENT DOCUMENTS

| 4,799,309 | A | * | 1/1989 | Cinzori et al. ................. 29/596 |
| 5,296,770 | A | | 3/1994 | Pflueger et al. ................ 310/14 |
| 5,652,471 | A | * | 7/1997 | Mayer et al. ............. 310/68 D |
| 5,675,205 | A | | 10/1997 | Jacob et al. ................. 310/239 |
| 5,977,669 | A | | 11/1999 | Yoshida et al. ........... 310/68 D |
| 6,198,191 | B1 | | 3/2001 | Chen et al. ................. 310/239 |
| 6,538,352 | B2 | * | 3/2003 | Asao ........................ 310/68 D |

FOREIGN PATENT DOCUMENTS

| DE | 42 32 929 A1 | 4/1994 |
| FR | 2 800 932 | 5/2001 |
| JP | 58-141645 | 8/1983 |

OTHER PUBLICATIONS

Bosch: Automotive Electrics and Electronics, 3 Edition, 1998, pp. 126–127.

* cited by examiner

*Primary Examiner*—Darren Schuberg
*Assistant Examiner*—Leda Pham
(74) *Attorney, Agent, or Firm*—Michael J. Striker

(57) ABSTRACT

A controller and rectifier for an electrical machine, in particular a three-phase generator for motor vehicles, is proposed in which the controller (13) and the rectifier (16) are embodied as an one-piece module (10).

9 Claims, 4 Drawing Sheets

CONTROLLER AND RECTIFIER FOR AN ELECTRICAL MACHINE, AND ELECTRICAL MACHINE

BACKGROUND OF THE INVENTION

The invention relates to a controller and to a rectifier as generically defined by the preamble to the independent claim. Known controllers and rectifiers are each produced separately as separate components and are secured to a bearing plate in the final assembly of the generator.

From the book entitled "*Autoelektrik, Autoelektronik/Bosch*" [Automotive Electrical Systems and Electronics by Bosch], published by Robert Bosch GmbH, 3rd Edition, 1998, a generator design of the kind usually used is described and shown on pages 126 and 127. A rectifier is secured to a bearing plate facing away from the driving pulley, and a separate controller is inserted into a radial recess in the rectifier.

In this design, which is chosen by many manufacturers, it is a disadvantage that many different contact points are needed between individual components, for instance between the stator connection wires and the rectifier and between the rectifier and the controller. These individual contact points are exposed to the most various climatic conditions and are also stressed by vibration. The consequence can be defective connections among the individual components.

SUMMARY OF THE INVENTION

The combination according to the invention of a controller with a rectifier, having the characteristics of the main claim, has the advantage that because of the embodiment of the controller and the rectifier as an one-piece module, on the one hand different connection points, for instance between the controller and the rectifier, are omitted and thus can no longer be impaired by various climatic and mechanical influences.

By the provisions recited in the dependent claims, advantageous refinements of the combination of the controller and rectifier of the main claim are possible.

For instance, if a first conductor track, which contacts the stator winding, and a second conductor track, which for instance contacts the B+ terminal, receive a rectifier element between them, then an extremely compact design of a rectifier unit is achieved.

An especially reliable connection between the individual conductor tracks and a rectifier element can be achieved by providing that the rectifier element is soldered by one side to the first conductor track and by a second side to the second conductor track. Moreover, both soldering processes can be performed simultaneously on both sides. Time is saved as a result.

If the rectifier and the controller are extrusion coated or surrounded with a substance that protects against corrosion, then only the terminal parts of the controller and rectifier protrude out of the thus-formed housing, but the connection parts between the rectifier and the controller no longer do so. Those parts are thereby protected against environmental factors.

The rectifier elements generate heat during operation, and as a result the material surrounding the rectifier elements is heated. For this reason, openings through which there can be a flow are provided in the surroundings of the rectifier elements, for cooling the rectifier elements. The air flowing through them cools the rectifier elements down to a noncritical level.

The openings in the extrusion coated substances can be embodied such that the first or second conductor track is partly uncovered by the substance. It is possible as a result for the waste heat generated by the rectifier elements, which is intrinsically transported onward anyway via the conductor tracks, finally to be output directly to the surroundings via the conductor tracks. This makes good utilization of the good thermal conduction of metal conductor tracks. Harmful heat is carried away from the rectifier elements.

In a further feature, it is provided that the openings uncovered by the sprayed-on substance, in the region of the rectifier element, contact heat sinks, or at least one conductor track, by thermal conduction. As a result, the intrinsically relatively small surface area of a conductor track is markedly increased by a heat sink, and the cooling effect is enhanced. This increases the current-carrying capacity of the rectifier element.

In a further exemplary embodiment, it is provided that a controller building block is secured to a conductor track that contacts a B− terminal and is electrically conductively secured to this conductor track.

It is also provided that a brush holder is jointly integrated with the one-piece module comprising the controller and rectifier. From originally three individual components—rectifier, controller, brush holder—now only a single remaining component comprising precisely these three individual elements is created. This greatly simplifies the final assembly of the generator.

In a further feature, it is provided that the rectifier element is either a passive element, such as a diode, or an active rectifying electrical element, such as an electronic switch.

An electrical machine with a controller and rectifier of the main claim has the advantage that on the one hand it can be produced with faster cycle times and on the other it is especially reliable, since various terminal points of the controller or rectifier are no longer exposed, unprotected, to ambient conditions.

BRIEF DESCRIPTION OF THE DRAWINGS

In the drawings, exemplary embodiments of a combination of a controller and rectifier are shown. Shown are.

For components functioning the same, identical reference numerals are given.

DETAILED DESCRIPTION OF THE PREFERRED EMBODIMENTS

Figure 1:
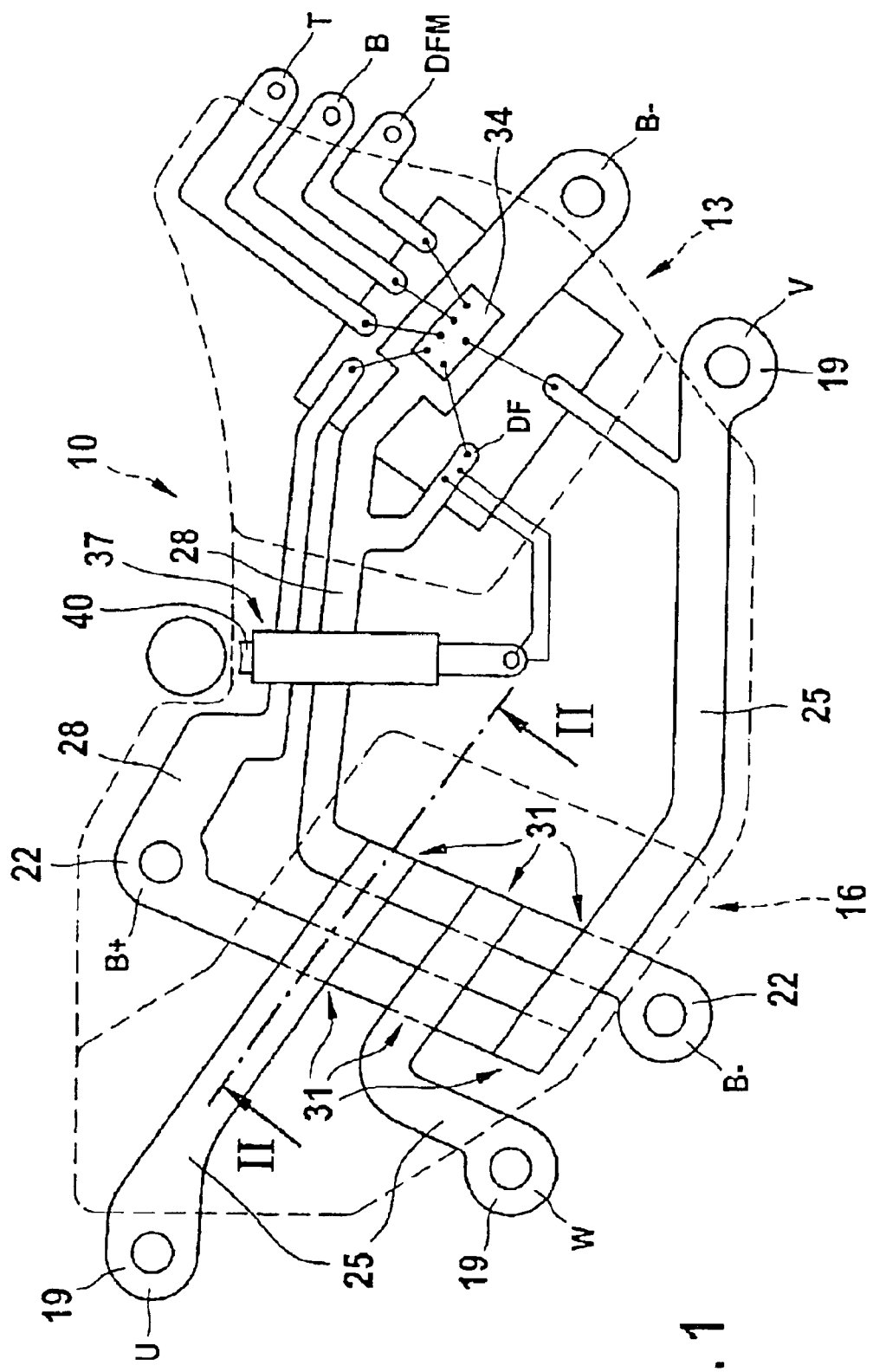
FIG. 1, a view of a controller and rectifier and of a brush holder for an electrical machine.

In FIG. 1, an one-piece module 10 is shown, as which a controller 13 and a rectifier 16 are embodied. This one-piece module 10 is intended for an electrical machine, in particular a three-phase generator for motor vehicles.

The rectifier 16—in this example embodied as a rectifier of a three-phase machine, that is, a three-phase electrical machine—can be connected on the input side to three phases of a stator winding. Terminals 19 to the three phases of the stator winding are marked U, V and W. The outputs 22 of the rectifier 16 are on the one hand a negative terminal B– and a positive terminal B+. The negative terminal B– serves to connect the rectifier to a ground contact; conversely, the positive terminal B+ serves as a terminal for a current conductor, not shown, which is connected to the positive pole of a starter battery or starter accumulator. From each stator terminal U, V and W, a respective first conductor track 25 leads to the rectifier 16. On the output side of the rectifier 16, each second conductor track 28 finally forms the negative terminal B– on the one hand and the positive terminal B+ on the other. Both second conductor tracks 28 finally also lead to the controller 13. The first conductor tracks 25 and the second conductor tracks 28 are disposed inside the rectifier 16 in such a way that they cross one another. As shown in FIG. 1, first conductor tracks 25 are thus located above second conductor tracks 28. Each first conductor track 25 thus crosses over both conductor tracks 28. There is accordingly a total of six crossing points 31, at each of which one rectifier element is disposed between a respective first conductor track 25 and an associated second conductor track 28.

As the second part of the one-piece module 10 comprising a controller 13 and a rectifier 16, the controller 13 will now be described. The controller 13 comprises a controller chip 34, on the one hand, which is secured to the second conductor track 28 that is connected to the negative terminal B–.

Because of the securing of the controller chip 34 to the second conductor track 28, waste heat that is generated can easily be dissipated. The controller chip 34 is connected on the one hand to at least one stator phase, in this example the stator phase having the terminal V, and on the other to the positive terminal B+, the negative terminal B–. Optionally, more than one phase can be connected. Furthermore, the controller chip 34 is connected to the outputs T, B and DFM. The terminal DF serves to supply current to the exciter coil, not shown, via a brush holder 37, or its brush 40. The terminals T, B and DFM are optional and can, as customer plugs, establish the connection of the generator to the onboard electrical system.

In the exemplary embodiment of FIG. 1, the brush holder 37 with the brush 40 is integrated with the module 10. In a variant, it can alternatively be provided that the brush holder 37 be secured as a separate part to the one-piece module comprising the controller 13 and the rectifier 16. Contacting of the brush 40 and its DF terminal to the DF output of the controller chip 34 can be done either at the time of securing the brush holder or after the brush holder 37 is secured to the module 10.

Figure 2:
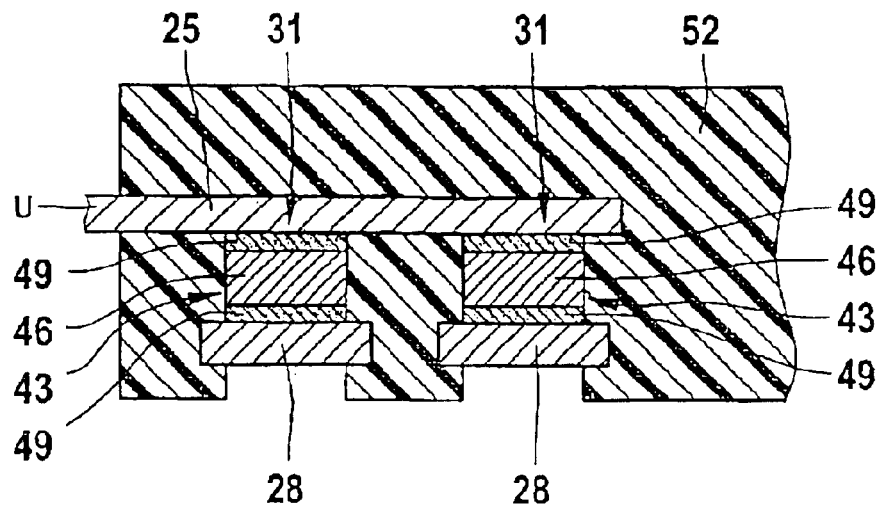
FIG. 2, a cross section through the rectifier.

In FIG. 2, a cross section through rectifier units 43 of the rectifier 16 is shown. As can be seen, one first conductor track 25 and each second conductor track 28 received between them one rectifier element 46. The rectifier element 46, in both instances shown, is soldered by one side to the first conductor track 25 and by a second side to the second conductor track 28 by means of solder 49.

The one-piece module 10 comprising the controller 13 and rectifier 16, for protection against external influences, such as corrosion, is with or surrounded by a substance 52 that protects against corrosion. The substance 52 is typically a potting compound or an injection molding plastic. For better cooling, it is provided that either the first conductor track 25 or the second conductor track 28 or even both conductor tracks in one rectifier element 46 to be left uncovered by this substance 52 that protects corrosion. Since the corrosion-protecting substance 52, particularly as a plastic, have inadequate thermal conduction properties, leaving at least one conductor track uncovered in the rectifier element 46 promotes the dissipation of heat from the rectifier element 46 via a conductor track 25 or 28. Where the conductor tracks are uncovered, the substance 52 thus has openings.

Figure 3A:
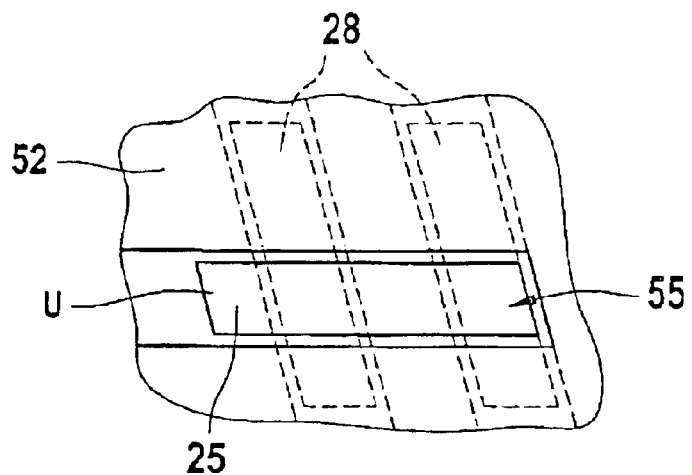
FIG. 3, a plan view on the rectifier.
Figure 3B:
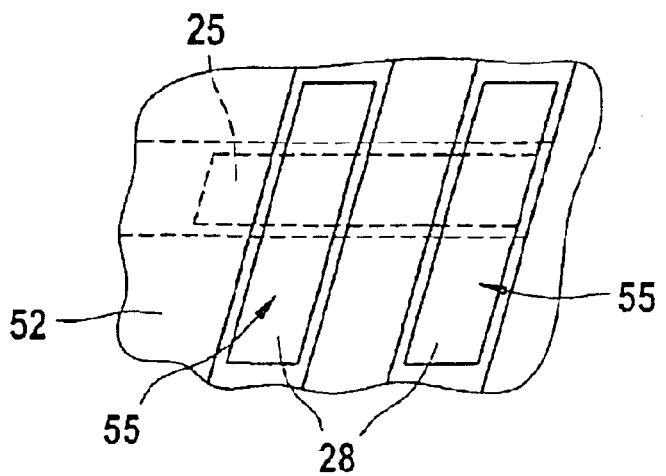

In FIG. 3*a*, a first conductor track 25 is shown, which is partly uncovered by the substance 52, and accordingly there is an opening 55 in the substance 52. FIG. 3*b* shows a view from below of the conductor tracks 25 and 28 in FIG. 3*a*.

Figure 4:
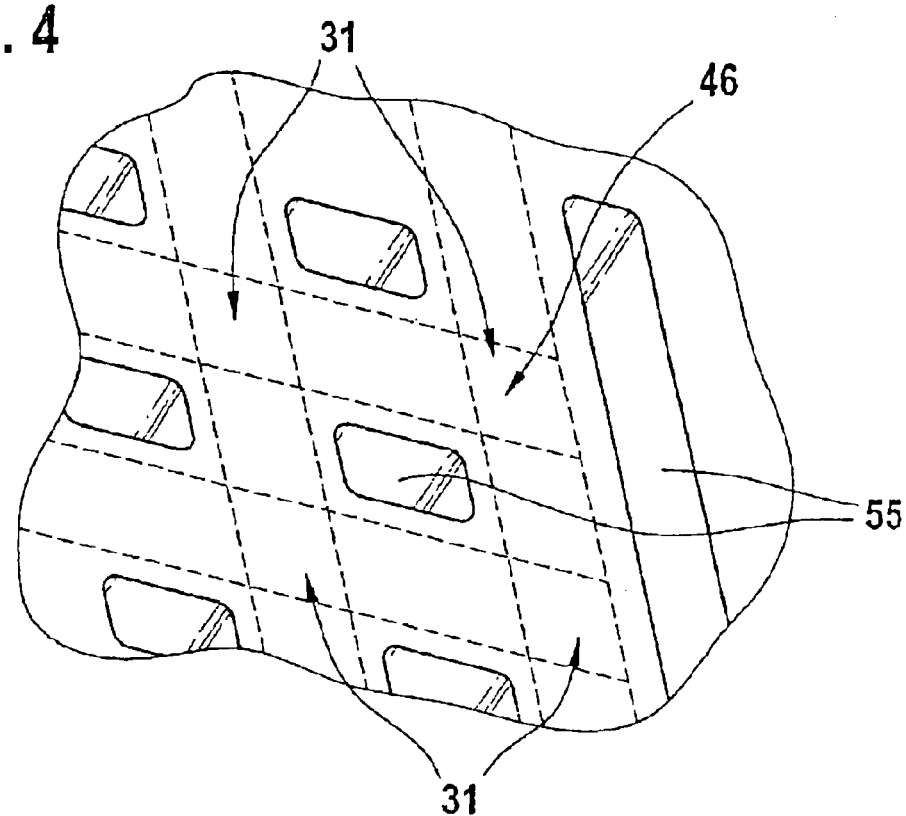
FIGS. 4a and 4b, two further plan views on a further exemplary embodiment of the rectifier.

In FIG. 4, a further variant of the rectifier 16 is shown. Here, the substance 52 has openings 55, in the surroundings of the rectifier elements 46, for cooling the rectifier elements 46. With comparatively slight wall thicknesses of the substance 52, the continuous openings 55 allow air to pass through these openings, thus making it possible to carry away heat output by the rectifier elements 46.

Figure 5:
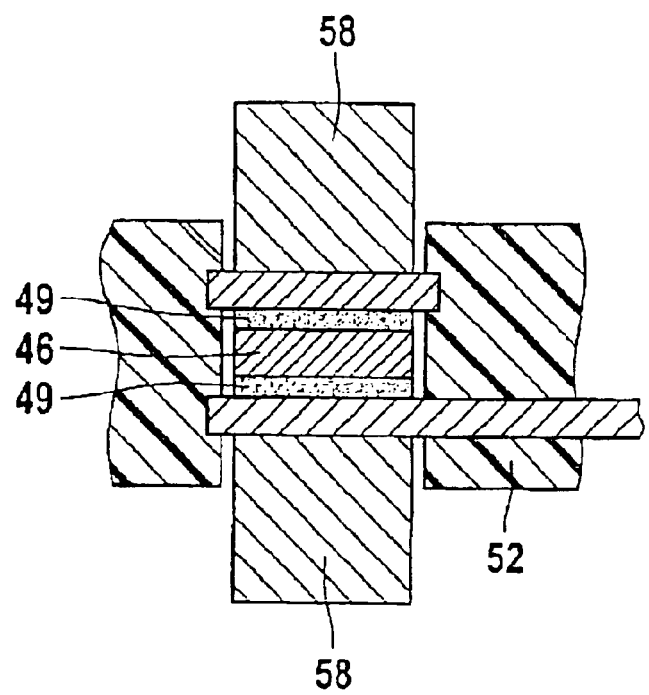
FIG. 5, a cross section through a further exemplary embodiment of the rectifier.

In FIG. 5, a further exemplary embodiment of a rectifier element 46 is shown. As in the exemplary embodiment of FIGS. 3*a* and 3*b*, the conductor tracks 25 and 28 are partly uncovered by the substance 52. To improve the cooling action for the rectifiers 46, one heat sink 58 each contacts the respective free, uncovered conductor tracks 25 and 28. Depending on the cooling requirements, it may be necessary for at least one conductor track to contact one heat sink.

For better heat dissipation, the heat sinks 58 may be provided with cooling fins in the usual way.

Figure 6:
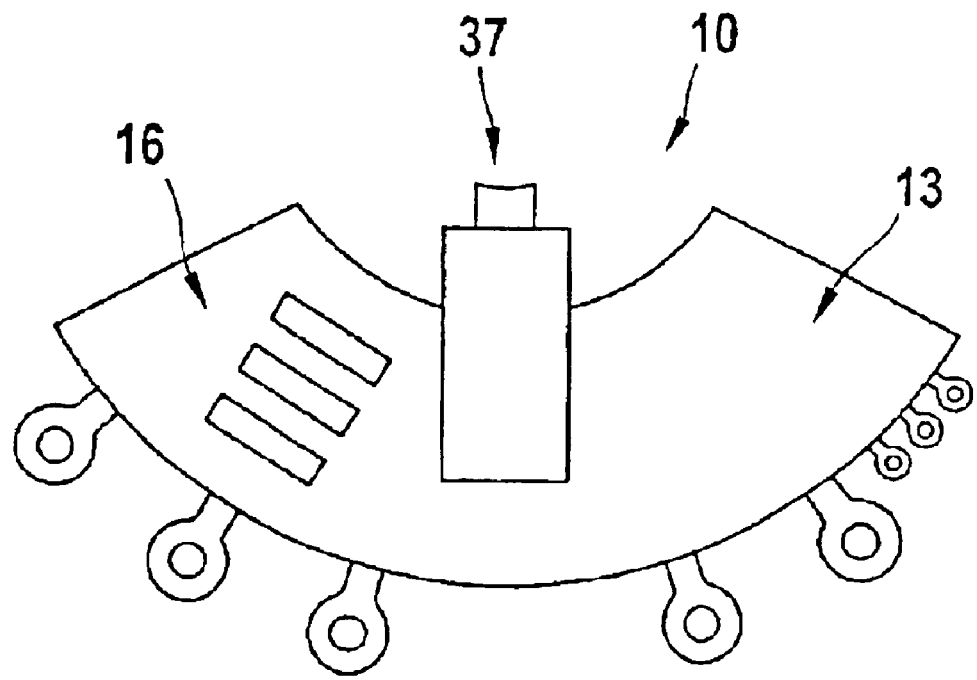
FIG. 6, the one-piece module comprising a controller, rectifier and brush holder.

FIG. 6 shows the one-piece module 10; the carrier 13, the rectifier 16, and the brush holder 37 are integrated in one piece into this module 10.

The rectifier element 46 can on the one hand be embodied as a passively rectifying diode or a diode chip or as an actively rectifying electrical element, which can for instance also function as an inverter.

Figure 7:
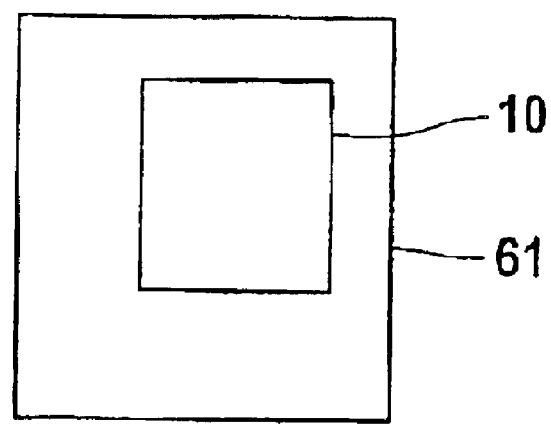
FIG. 7, an electrical machine with an integral controller and rectifier.

In FIG. 7, finally, an electrical machine 61 is shown, which has an one-piece module 10 of the invention.

What is claimed is:

1. A controller and rectifier for an electrical machine the form of a rotary current generator for motor vehicles, wherein the controller (13) and the rectifier (16) are embodied as a one-piece module (10), wherein a first conductor track (25) and a second conductor track (28) between them receive a rectifier element (46), and wherein the rectifier element (46) is soldered by a first side to the first conductor track (25) and by a second side the second conductor track (28).

2. The controller and rectifier of claim 1, wherein the rectifier (16) and the controller (18) are extrusion coated or surrounded with a substance (52) that protects against corrosion.

3. The controller and rectifier of claim 2, wherein substance (52) has openings (55), in the surroundings of the rectifier elements (46), for cooling the rectifier elements (46).

4. The controller and rectifier of claim 3, wherein the openings (55) in the substance (52) leave the first and/or the second conductor track (25 and 28, respectively) partly uncovered by the substance (52).

5. The controller and rectifier of claim 4, wherein a heat sink (58) thermally conductively contacts at least one conductor track (25 or 28) at the openings (55) that are uncovered by the substance (52).

6. The controller and rectifier of claim 1, wherein a controller chip on a conductor track that contacts a negative terminal (B−) is electrically conductively secured to that conductor track.

7. The controller and rectifier of claim 1, wherein a brush holder (37) is jointly integrated with the one-piece module (10).

8. The controller and rectifier of claim 1, wherein the at least one rectifier element (46) is a passively or actively rectifying electrical element.

9. An electrical machine, wherein the controller and rectifier are embodied in accordance with claim 1.

\* \* \* \* \*